United States Patent
Rohr et al.

(10) Patent No.: US 10,752,779 B2
(45) Date of Patent: *Aug. 25, 2020

(54) NAPHTHOL AS-PIGMENTS

(71) Applicant: CLARIANT PLASTICS AND COATINGS LTD, Muttenz (CH)

(72) Inventors: Ulrike Rohr, Weinheim (DE); Joachim Eichhorn, Frankfurt am Main (DE)

(73) Assignee: Clariant Plastics & Coatings Ltd, Muttenz (CH)

( * ) Notice: Subject to any disclaimer, the term of this patent is extended or adjusted under 35 U.S.C. 154(b) by 0 days.

This patent is subject to a terminal disclaimer.

(21) Appl. No.: 15/738,519

(22) PCT Filed: May 31, 2016

(86) PCT No.: PCT/EP2016/062290
§ 371 (c)(1),
(2) Date: Dec. 20, 2017

(87) PCT Pub. No.: WO2016/206925
PCT Pub. Date: Dec. 29, 2016

(65) Prior Publication Data
US 2018/0179387 A1    Jun. 28, 2018

(30) Foreign Application Priority Data

Jun. 25, 2015 (DE) .................. 10 2015 211 827

(51) Int. Cl.
| G03G 9/00 | (2006.01) |
|---|---|
| C09B 29/01 | (2006.01) |
| C09D 11/322 | (2014.01) |
| C08K 5/23 | (2006.01) |
| G03F 7/00 | (2006.01) |
| G03G 9/09 | (2006.01) |
| C09D 11/037 | (2014.01) |
| C09B 29/18 | (2006.01) |
| G03F 7/105 | (2006.01) |
| C08K 5/00 | (2006.01) |

(52) U.S. Cl.
CPC ............ C09B 29/0018 (2013.01); C08K 5/23 (2013.01); C09B 29/0003 (2013.01); C09B 29/18 (2013.01); C09D 11/037 (2013.01); C09D 11/322 (2013.01); G03F 7/0007 (2013.01); G03G 9/091 (2013.01); C08K 5/0041 (2013.01); G03F 7/105 (2013.01)

(58) Field of Classification Search
CPC ........ G03G 9/091; G03F 7/0007; C08K 5/23; C09B 29/0003; C09B 29/20; C09B 29/18; C09B 29/0018; C09D 11/037; C09D 11/322
USPC ..................................... 430/108.23
See application file for complete search history.

(56) References Cited

U.S. PATENT DOCUMENTS

| 2,006,211 | A | * | 6/1935 | Fischer | ............... | C08K 5/23 |
|---|---|---|---|---|---|---|
| | | | | | | 524/190 |
| 2,084,555 | A | * | 6/1937 | Fischer | ............... | C08K 5/23 |
| | | | | | | 524/190 |
| 3,113,938 | A | * | 12/1963 | Nakaten | ............... | C09B 29/20 |
| | | | | | | 106/150.1 |
| 5,830,608 | A | * | 11/1998 | Ishiwata | ............... | G03F 7/0007 |
| | | | | | | 430/7 |
| 7,709,172 | B2 | * | 5/2010 | Yasumura | ............ | C07D 341/00 |
| | | | | | | 430/108.5 |
| 7,833,343 | B2 | * | 11/2010 | Plueg | ............... | C09B 67/0013 |
| | | | | | | 106/493 |

FOREIGN PATENT DOCUMENTS

| DE | 1228731 B | 11/1966 |
|---|---|---|
| FR | 1278821 A | 12/1961 |
| WO | 2005/105928 A1 | 11/2005 |

OTHER PUBLICATIONS

Morrison, et al., Organic Chemistry, Allyn and Bacon, Inc., (Boston) 1965, pp. 570-571, and 577-578. (Year: 1965).*
International Search Report and Written Opinion dated Aug. 23, 2016, issued in corresponding International Patent Application No. PCT/EP2016/062290.

* cited by examiner

*Primary Examiner* — Mark A Chapman
(74) *Attorney, Agent, or Firm* — Morgan, Lewis & Bockius LLP

(57) ABSTRACT

Naphthol AS-pigments of formula (I), wherein R1 represents methyl or C3-C8-alkyl; R2 represents hydrogen or C1-C4-alkyl; Y represents C1-C4-alkyl or C1-C4-alkoxy; and Z' represents hydrogen, phenyl, naphthyl, or substituted phenyl or substituted naphthyl, wherein the number of substituents can be 1, 2, 3 or 4 and are selected from the group consisting of halogen, nitro, cyano, C1-C4-alkoxycarbonyl, carbamoyl, C1-C4-alkylcarbamoyl, di(C1-C4)-alkylcarbamoyl, phenylcarbamoyl, sulfamoyl, phenylsulfannoyl, C1-C4-alkylsulfamoyl, di(C1-C4)-alkylsulfamoyl, C1-C4-acylamino, C1-C4-alkyl and C1-C4-alkoxy.

18 Claims, No Drawings

NAPHTHOL AS-PIGMENTS

The present invention is in the field of the azo pigments.

Naphthol AS pigments are of particular industrial interest, since they usually attain high color intensities and cover the magenta region of the process color set. In addition, they have good lightfastness.

It is often a requirement, however, that they have high brilliance (chroma) as well as the bluish-red magenta hue. These requirements have to date been achieved by mixing the azo pigments with quinacridone pigments, for example PR 122, but this has a disadvantageous effect on color intensity and process costs.

The present invention now describes novel naphthol AS pigments that do not show this disadvantage and, especially when used as mixing components with appropriate other naphthol AS pigments or in mixtures with one another, have the effect that colors produced therefrom have a brilliant magenta hue with simultaneously high color intensity and transparency at low cost.

The invention provides naphthol AS pigments of the formula (I)

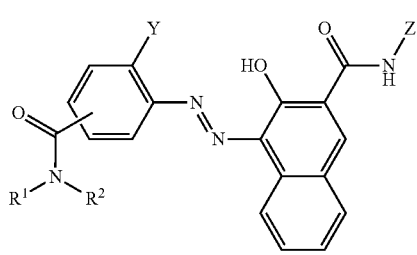

(I)

in which $R^1$ is methyl or $C_3$-$C_8$-alkyl;

$R^2$ is hydrogen or $C_1$-$C_4$-alkyl;

Y is $C_1$-$C_4$-alkyl or $C_1$-$C_4$-alkoxy; and

Z' is hydrogen, phenyl, naphthyl, or substituted phenyl or substituted naphthyl, where the substituents are 1, 2, 3 or 4 in number and are selected from the group of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-acylamino, $C_1$-$C_4$-alkyl and $C_1$-$C_4$-alkoxy.

Preference is given to naphthol AS pigments of the formula (I) in which $R^1$ is methyl.

Preference is further given to naphthol AS pigments of the formula (I) in which $R^2$ is hydrogen.

Particular preference is given to naphthol AS pigments of the formula (I) in which $R^1$ is methyl and $R^2$ is hydrogen.

Preference is further given to naphthol AS pigments of the formula (I) in which Y is $C_1$-$C_2$-alkoxy or $C_1$-$C_2$-alkyl, especially methyl or methoxy.

Preference is further given to naphthol AS pigments of the formula (I) in which Z' is hydrogen, phenyl or substituted phenyl, where the substituents are 1, 2, 3 or 4 in number and are selected from the group of halogen, such as F, Cl or Br, nitro, cyano, $C_1$-$C_4$-alkoxycarbonyl, carbamoyl, $C_1$-$C_4$-alkylcarbamoyl, phenylcarbamoyl, sulfamoyl, phenylsulfamoyl, $C_1$-$C_4$-alkylsulfamoyl, $C_1$-$C_4$-acylamino, $C_1$-$C_4$-alkoxy and $C_1$-$C_4$-alkyl.

Particular preference is given to naphthol AS pigments of the formula (I) in which Z' is hydrogen, phenyl or phenyl substituted by nitro, cyano, $C_1$-$C_4$-alkyl, especially methyl or ethyl.

Very particular preference is given to naphthol AS pigments of the formula (I) in which Z' is defined as phenyl, or phenyl substituted by one, two or three radicals from the group of methyl, ethyl and nitro.

Especially preferred in the context of the present invention are naphthol AS pigments of the formula (I) in which $R^1$ is methyl;

$R^2$ is hydrogen;

Y is $C_1$-$C_4$-alkoxy, especially methoxy or ethoxy; and

Z is phenyl, methylphenyl or nitrophenyl.

The inventive pigments of the formula (I) can be prepared by diazotization of an amine of the formula (III)

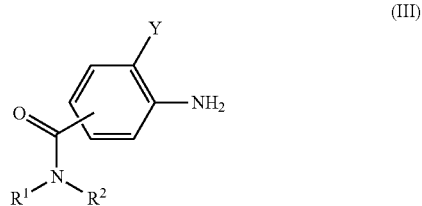

(III)

in an acidic medium and subsequent coupling of the diazonium compound thus obtained with a coupling component of the formula (IV)

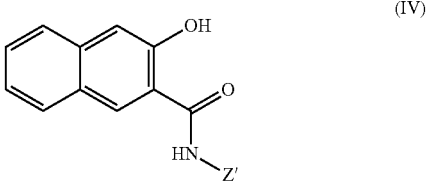

(IV)

The substituents $R^1$, $R^2$, Y in the formula (III) and Z' in the formula (IV) here have one of the definitions given above.

Subsequently, the pigment suspension obtained can be filtered and the moist presscake obtained can appropriately be dried to constant weight.

The azo coupling reaction is preferably effected in aqueous solution or suspension, and preferably at a pH between 3 and 9, but it is also possible to use organic solvents, optionally in a mixture with water, for example alcohols having 1 to 10 carbon atoms, for example methanol, ethanol, n-propanol, isopropanol, butanols such as n-butanol, sec-butanol, tert-butanol, pentanols such as n-pentanol, 2-methyl-2-butanol, hexanols such as 2-methyl-2-pentanol, 3-methyl-3-pentanol, heptanols such as 2-methyl-2-hexanol, 3-ethyl-3-pentanol, octanols such as 2,4,4-trimethyl-2-pentanol, cyclohexanol; or glycols such as ethylene glycol, diethylene glycol, propylene glycol, dipropylene glycol, or glycerol; polyglycols such as polyethylene glycols or polypropylene glycols; ethers such as methyl isobutyl ether, tetrahydrofuran or dimethoxyethane; glycol ethers such as monomethyl or monoethyl ethers of ethylene glycol or propylene glycol, diethylene glycol monomethyl ether, diethylene glycol monoethyl ether, butylglycols or methoxybutanol; ketones such as acetone, diethyl ketone, methyl isobutyl ketone, methyl ethyl ketone or cyclohexanone; aliphatic acid amides such as formamide, dimethylformamide, N-methylacetamide or N,N-dimethylacetamide; urea derivatives such as tetramethylurea; or cyclic carboxamides such as N-methylpyrrolidone, valerolactam or caprolactam; esters such as $C_1$-$C_6$-alkyl carboxylates such as butyl formate, ethyl acetate or propyl propionate; or $C_1$-$C_6$ glycol carboxylates; or glycol ether acetates such as 1-methoxy-2-propyl acetate; or $C_1$-$C_6$-alkyl phthalates or benzoates such as ethyl benzoate; cyclic esters such as caprolactone; nitriles such as acetonitrile or benzonitrile; aliphatic or aromatic hydrocarbons such as cyclohexane or benzene; or alkyl-, alkoxy-, nitro- or halogen-substituted benzene such as toluene, xylenes, ethylbenzene, anisole, nitrobenzene, chlorobenzene, o-dichlorobenzene, 1,2,4-trichlorobenzene or bromobenzene; or other substituted aromatics such as benzoic acid or phenol; aromatic heterocycles such as pyridine, morpholine, picoline or quinoline; and hexamethylphosphoramide, 1,3-dimethyl-2-imidazolidinone, dimethyl sulfoxide and sulfolane. The solvents mentioned can also be used in the form of mixtures. Preference is given to using water-miscible solvents.

In the process of the invention, it is also possible to use auxiliaries, for example surfactants, pigmentary and nonpigmentary dispersants, fillers, standardizers, resins, waxes, defoamers, dust suppressants, extenders, shading colorants, preservatives, drying retardants, rheology control additives, wetting agents, antioxidants, UV absorbers, light stabilizers, or a combination thereof.

The addition of the auxiliaries can be effected at a particular time before, during or after the synthesis, all at once or in several portions. The auxiliaries can be added, for example, directly to the solutions or suspensions of the reactants, or else during the reaction in liquid, dissolved or suspended form.

The total amount of the auxiliaries added may be 0% to 40% by weight, preferably 1% to 30% by weight, more preferably 2.5% to 25% by weight, based on the total weight of the pigment plus auxiliaries.

Useful surfactants include anionic or anion-active, cationic or cation-active and non-ionic substances or mixtures of these agents.

Examples of surfactants and pigmentary and nonpigmentary dispersants which can be used for the process of the invention are specified in EP-A-1 195 411.

Since compliance with a desired pH during and after the reaction is often crucial for quality, it is also possible to feed in buffer solutions, preferably of organic acids and salts thereof, for example formic acid/formate buffer, acetic acid/acetate buffer, citric acid/citrate buffer; or of inorganic acids and salts thereof, for example phosphoric acid/phosphate buffer or carbonic acid/hydrogencarbonate or carbonate buffer.

On completion of azo coupling, there may follow a finish by means of direct further stirring of the aqueous reaction mixture at temperatures between 20 and 95° C. A finish comprises the taking-up of the naphthol AS pigment prepared, either directly from the synthesis or after intermediate isolation, for example as a presscake (solids content about 5% to 30% by weight), in one of the abovementioned organic solvents.

Preferred solvents here are $C_3$-$C_4$ alcohols, glycol ethers and chlorinated benzenes, for example isopropanol, isobutanol, butoxyethanol, ortho-dichlorobenzene or a mixture thereof.

The amount of the solvent is preferably 1% to 30% by volume, especially 5% to 15% by volume, based on the volume of the pigment suspension, or 1 to 10 times the weight of solvent, based on the weight of the pigment in the presscake.

The pigment finish is preferably stirred at a temperature between 20° C. and 150° C., especially between 40° C. and 90° C., optionally under pressure, and preferably for 0.1 to 2 hours, especially 0.25 to 1 hour, and preferably at standard pressure.

Useful stirring apparatus is standard stirring apparatus, for example laboratory stirrers. An alternative in principle is to use an inline dispersing machine equipped with appropriate dispersing tools in the pumped circulation system of the reservoir vessel. A dispersing machine of this kind firstly assures vigorous mixing of the suspension in the reservoir vessel, but simultaneously also has a deagglomerating effect, such that any inclusions are released.

Subsequently, the solvent-treated pigment suspension is filtered and washed.

The naphthol AS pigments of the invention are notable for a magenta hue and/or for high brilliance (chroma), which makes the pigments of the invention attractive for many industrial uses. For instance, they can be used for pigmentation of high molecular weight organic materials of natural or synthetic origin, for example of plastics, resins, varnishes, paints and seed.

It is unimportant here whether the high molecular weight organic compounds are in the form of powder, plastic masses, melts or spin solutions, or of dispersions, varnishes or paints. According to the end use, it is found to be advantageous to use the naphthol AS pigments of the invention as a blend or in the form of preparations or dispersions. Based on the high molecular weight organic material to be pigmented, the naphthol AS pigments of the invention are usually used in an amount of 0.05% to 30% by weight, preferably 0.1% to 15% by weight.

The pigments of the invention are additionally suitable as colorants in electrophotographic toners and developers, for example one- or two-component powder toners (also called one- or two-component developers), magnetic toners, liquid toners, latex toners, polymerization toners and specialty toners. These may be used in conventional toner production processes by means of extrusion or else in chemical toner production processes such as emulsion, aggregation or suspension polymerization.

Toner particles can also be used for cosmetic and pharmaceutical applications, for example for coating of tablets.

Typical toner binders are polymerization resins, polyaddition resins and polycondensation resins, such as styrene resins, styrene-acrylate resins, styrene-butadiene resins, acrylate resins, polyester resins, phenol-epoxy resins, polysulfones, polyurethanes, individually or in combination, and also polyethylene and polypropylene, which may also comprise further constituents, such as charge control agents, waxes or flow auxiliaries, or be modified with these additives subsequently.

In addition, the pigments of the invention are suitable as colorants in water-based and non-water-based inkjet inks, microemulsion inks, UV inks, and in those inks that work by the hotmelt method.

Inkjet inks generally contain a total of 0.5% to 50% by weight, preferably 1% to 25% by weight (calculated in dry form), of one or more of the pigments of the invention.

Water-based inkjet inks contain essentially 0.5% to 30% by weight, preferably 1 to 15% by weight, of the pigments of the invention, 70% to 95% by weight of deionized water, dispersing aids, optionally carrier polymer and humectants.

Solvent-based inkjet inks contain essentially 0.5% to 30% by weight, preferably 1% to 15% by weight, of the pigments of the invention, and 70% to 95% by weight of an organic solvent or solvent mixture and/or a hydrotropic compound. Optionally, the solvent-based inkjet inks may comprise carrier materials and binders that are soluble in the "solvent", for example polyolefins, natural and synthetic rubber, polyvinyl chloride, vinyl chloride/vinyl acetate copolymers, polyvinyl butyrals, wax/latex systems or combinations of these compounds.

Optionally, the solvent-based inkjet inks may also comprise further additives, for example wetting agents, degassers/defoamers, preservatives and antioxidants.

Microemulsion inks are based on organic solvents, water and optionally an additional substance that acts as interface mediator (surfactant). Microemulsion inks contain 0.5% to 30% by weight, preferably 1% to 15% by weight, of the pigments of the invention, 0.5% to 95% by weight of water and 0.5% to 95% by weight of organic solvents and/or interface mediators.

UV inks typically consist of monomers of low molecular weight mono-, di-, tri-, tetra- and/or pentafunctional acrylates and/or acrylate-, urethane-, epoxy- or polyester-based oligomers. The UV inks are typically initiated/crosslinked by cationic, anionic or free-radical means.

UV-curable inks contain essentially 0.5% to 30% by weight of the pigments of the invention, 0.5% to 95% by weight of water, 0.5% to 95% by weight of an organic solvent or solvent mixture, 0.5% to 50% by weight of a radiation-curable binder and optionally 0% to 10% by weight of a photoinitiator.

Hotmelt inks are usually based on waxes, fatty acids, fatty alcohols or sulfonamides that are solid at room temperature and become liquid when heated, the preferred melting range being between about 60° C. and about 140° C. Hotmelt inkjet inks consist essentially of 20% to 90% by weight of wax and 1% to 10% by weight of the pigments of the invention. In addition, 0% to 20% by weight of an additional polymer (as "dye dissolver"), 0% to 5% by weight of dispersants, 0% to 20% by weight of viscosity modifiers, 0% to 20% by weight of plasticizers, 0% to 10% by weight of tackifying additive, 0% to 10% by weight of transparency stabilizer (prevents, for example, the crystallization of the wax) and 0% to 2% by weight of antioxidant may be present.

In addition, the pigments of the invention are also suitable as colorants for color filters, both for additive and for subtractive color generation, and as colorants for electronic inks ("e-inks") or electronic paper ("e-paper").

In the production of color filters, both reflective and transparent color filters, pigments in the form of a paste or as pigmented photoresists in suitable binders (acrylates, acrylic esters, polyimides, polyvinyl alcohols, epoxides, polyesters, melamines, gelatins, caseins) are applied to the respective LCD components (e.g. TFT-LCDs=thin-film transistor liquid-crystal displays or, for example, (S) TN-LCD= (super) twisted nematic-LCD). As well as high thermal stability, a high pigment purity (chroma) is also a prerequisite for a stable paste or a pigmented photoresist. Furthermore, the pigmented color filters can also be applied by inkjet printing methods or other suitable printing methods.

It is also possible to use the pigments of the invention for production of conventional printing inks (for example offset printing, flexographic printing, intaglio printing etc.).

The pigments of the invention are notable for a bluish magenta hue and/or for high brilliance.

In the examples which follow, parts mean parts by weight and percent means percent by weight.

EXAMPLE 1 a1) Preparation of the Diazonium Salt Solution:
2200 g of demineralized water are initially charged, 180 g of N-methyl-3-amino-4-methoxybenzamide are scattered in and the mixture is stirred homogeneously at room temperature. After 15 minutes, the mixture is cooled to 2° C. by adding 800 g of ice and by additional external cooling, and then 290 g of hydrochloric acid (31%) are added. The precipitated hydrochloride is diazotized by adding 179 g of sodium nitrite solution (40%) at 5 to 10° C. over the course of 15 to 20 minutes. The diazonium salt solution is stirred in an excess of nitrite for 1.5 h, then a clarifying aid is added and then the mixture is filtered and any nitrite excess is eliminated by addition of amidosulfonic acid.

a2) Preparation of a Solution of the Coupling Component:
2720 g of water are initially charged and heated to 80° C. While stirring, 308 g of N-(3-nitrophenyl)-3-hydroxynaphthalene-2-carboxamide are introduced and dissolved under alkaline conditions at 90 to 95° C. by adding sodium hydroxide solution (33%). Subsequently, the mixture is cooled down to below 80° C. by adding ice and the warm solution is optionally filtered with the aid of a clarifying aid.

a3) Azo Coupling:
The clarified diazonium salt solution from a1) is initially charged, adjusted to pH 4.3-4.5 by adding about 38 g of sodium acetate (in the form of a 4 N solution) and cooled to 10° C. by adding ice. Thereafter, the warm coupler solution from a2) is metered in over the course of 1 to 1.5 h while stirring, while keeping the pH at 4.8-5 by simultaneous addition of a total of about 190 g of hydrochloric acid (31%). Subsequently, the mixture is stirred for about 2.5-3 h or until the disappearance of the diazo component at RT to 30° C. and pH 5 to 6. After the coupling reaction has ended, the mixture is heated to above 50° C. for another 1 h, then filtered and washed with water.

After drying and grinding, 499 g of a dark red bluish powder of the pigment of the formula (1) are obtained.

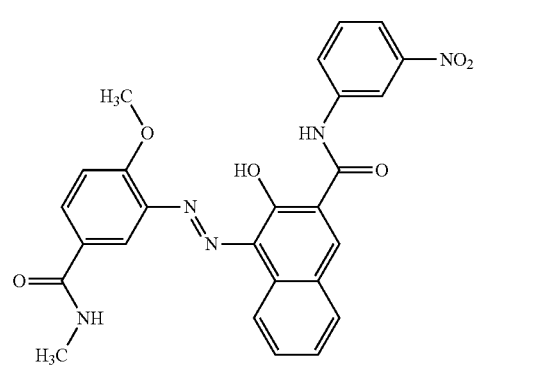

(1)

EXAMPLE 2 a1) the Preparation of the Diazonium Salt Solution is Effected as Described in Example 1, a1).

a2) Preparation of a Solution of the Coupling Component:
2000 g of water are initially charged and 277 g of N-(2-methylphenyl)-3-hydroxynaphthalene-2-carboxamide are introduced with stirring, the mixture is heated to 95° C. and the solids are dissolved under alkaline conditions by adding 330 g of sodium hydroxide solution (33%) at 90 to 95° C. within a few minutes. Subsequently, the mixture is rapidly cooled to below 80 to 60° C. by adding ice and kept at this temperature. The warm solution can optionally still be filtered with addition of a clarifying aid.

a3) Azo Coupling:

3000 g of water/ice are initially charged, 280 g of acetic acid and 110 g of sodium acetate (in the form of a 4 N solution) are added and the pH is adjusted to 4. The temperature is adjusted to 10° C. by adding ice and then, with good stirring, the coupler solution from a2) is added dropwise, in the course of which the coupler precipitates out and gives rise to a suspension. The temperature is kept at 10 to 15° C. by adding further ice and, on completion of coupler addition, the pH is adjusted to 5. The diazonium salt solution from a1) is added dropwise to the coupler suspension over the course of 1.5 h and the pH is kept at 5 to 5.5 with sodium hydroxide solution. After the diazonium salt addition has ended, the mixture is stirred at room temperature to 30° C. and pH 5.5 to 6 until the diazo component has disappeared. After the coupling reaction has ended, the mixture is heated to above 50° C. for another 1 h, then filtered and washed with water. After drying and grinding, 468 g of a dark red powder of the pigment of the formula (2) are obtained.

Further naphthol AS pigments of the invention were produced analogously to example 1 or 2 and are listed in table 1 below.

In addition, the chroma and the hue angle were determined in an alkyd resin (0.5% strength).

In the resin system and test system mentioned, the chroma C of the pigments of the invention is preferably between 58 and 74 (74>C>58) and more preferably between 60 and 70 (70>C>60). In the case of a bluish magenta pigment, the hue h is preferably between 345 and 360 or between 0 and 15 and more preferably between 350 and 360 or between 0 and 10 (CIELAB coordinates).

a) Production of the 0.5% Alkyd Resin:

In a plastic cup, 0.45 g of a pigment of the invention and 29.55 g of 31.8% grinding varnish (45.38% Vialkyd® AS 673 h/70% WS, 2.58% Octa-Soligen® 10% Ca, 2.82% STA soya lecithin concentrate and 49.22% 145/200 petroleum spirit) are weighed out and dispersed at 660 rpm with an agitating machine with addition of 85 g of glass beads having a diameter of 3 mm for 15 min.

Into this varnish are gradually weighed, in 5 portions of increasing size, a total of 60 g of siccatived letdown mixture, 54% strength (77.14% Vialkyd® AS 673 h/70% WS, 0.9% Bykanol®-N, 19.16% 145/200 petroleum spirit and 2.8% Octa-Soligen®173 desiccant), and immediately mixed thoroughly each time. On completion of addition, the mixture is mixed homogeneously with the agitating machine for another 3 minutes and then the glass beads are sieved off.

b) Paint Test for Coloristic Properties:

The paint thus obtained is applied by means of a manual coater to a film applicator and applied in a wet film thickness of 100 μm to a test card (Chromo board, white, cast-coated on one side, 300 g/m², size 100×230 mm). The paint card is dried first at room temperature for 15 min and then in a drying cabinet at 60° C. for 60 min. The values for chroma (C) and hue (h) are measured by means of a D65 standard illuminant lamp at an observation angle of 10° with a Datacolor—Spectraflash—SF600—PLUS CT spectrophotometer, according to DIN 5033-7, ISO 7724-2.

The test results in the paint are reported in table 1 below.

TABLE 1

| Example | Pigment of formula (I) | Chroma C | Hue angle h |
|---|---|---|---|
| 1 | 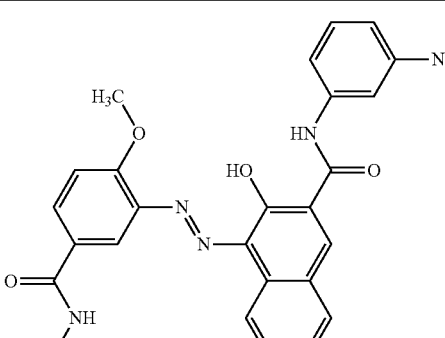 | 58.8 | 352.4 |

TABLE 1-continued
| Example | Pigment of formula (I) | Chroma C | Hue angle h |
|---|---|---|---|
| 2 | 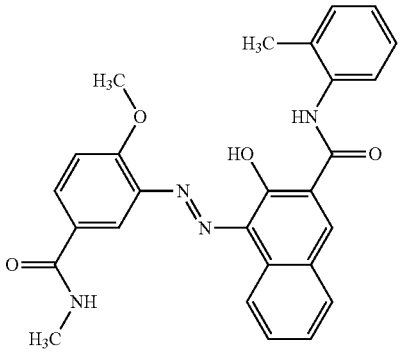 (2) | 72 | 11.4 |
| 3 | 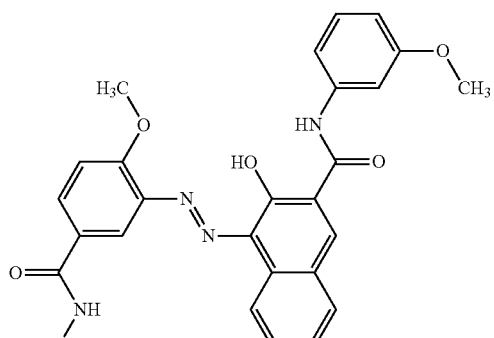 (3) | 68 | 6 |
| 4 | 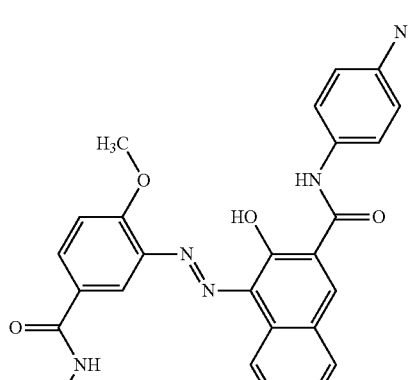 (4) | 61 | 357 |
| 5 | 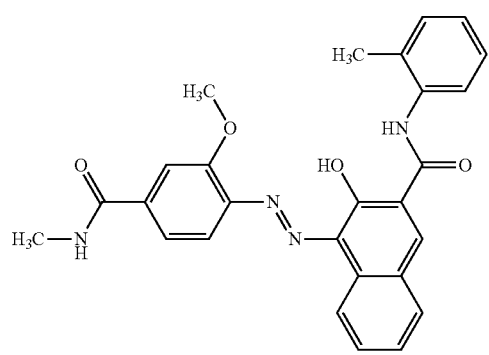 (5) | 70 | 10 |

TABLE 1-continued
| Example | Pigment of formula (I) | Chroma C | Hue angle h |
|---|---|---|---|
| 6 | 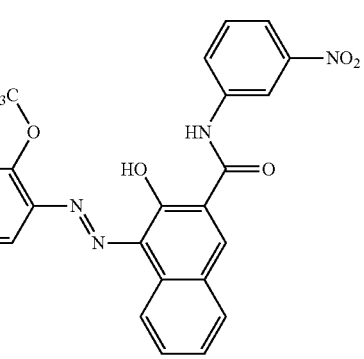 (6) | 61 | 354 |
| 7 | 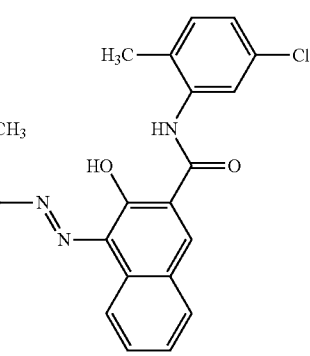 (7) | 64 | 5.5 |
| 8 | 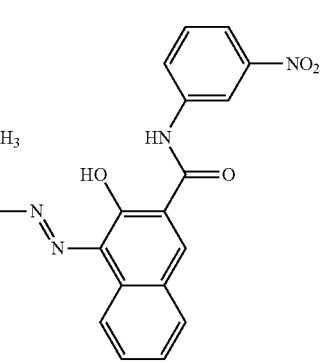 (8) | 60 | 358 |
| 9 | 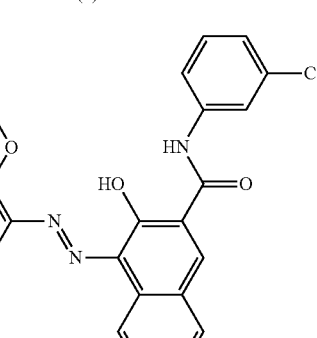 (9) | 68.5 | 5.5 |

TABLE 1-continued
| Example | Pigment of formula (I) | Chroma C | Hue angle h |
|---|---|---|---|
| 10 | 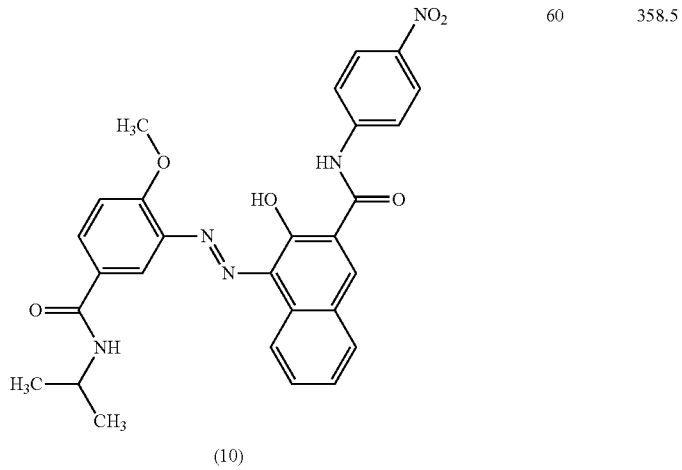 (10) | 60 | 358.5 |
| 11 | 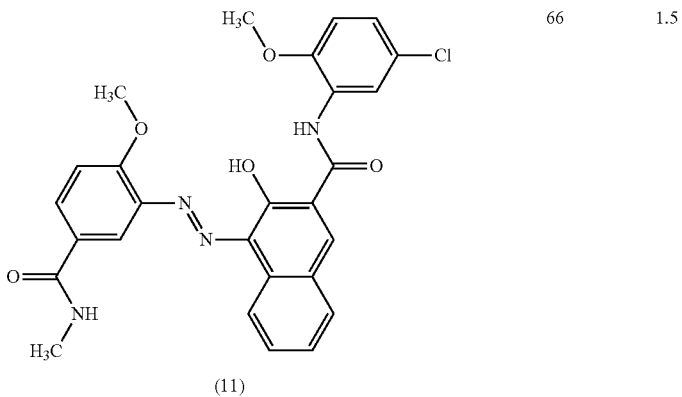 (11) | 66 | 1.5 |
| 12 | 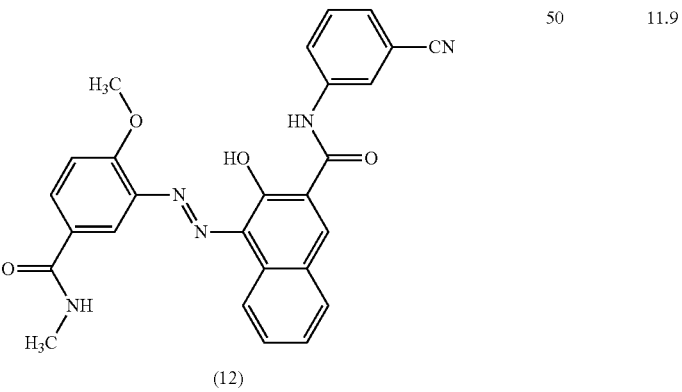 (12) | 50 | 11.9 |

TABLE 1-continued
| Example | Pigment of formula (I) | Chroma C | Hue angle h |
|---|---|---|---|
| 13 | 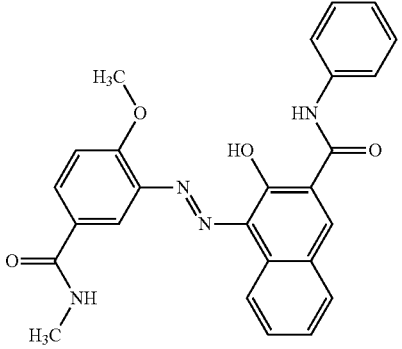<br>(13) | 67.5 | 12 |
| 14 | 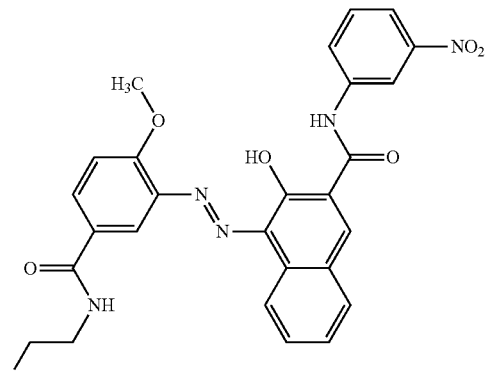<br>(14) | 59 | 354 |
| 15 | 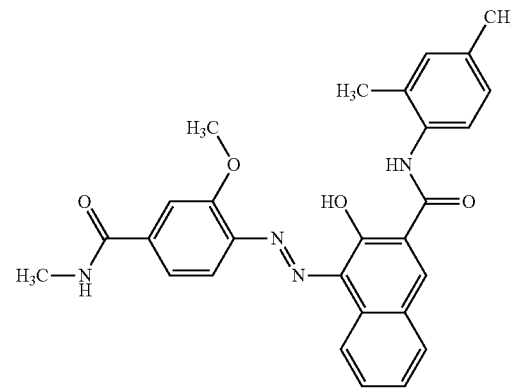<br>(15) | 65 | 5 |

TABLE 1-continued
| Example | Pigment of formula (I) | Chroma C | Hue angle h |
|---|---|---|---|
| 16 | 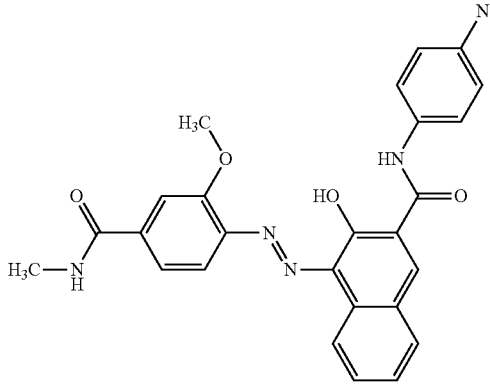 (16) | 61.5 | 358 |
| 17 | 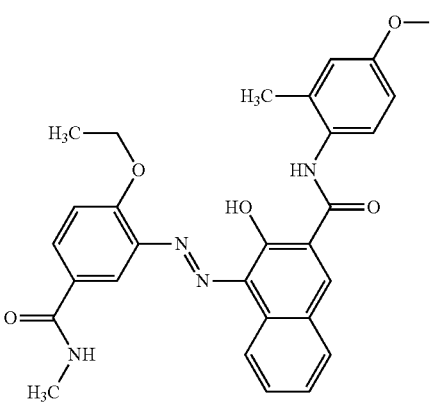 (17) | 64 | 3.5 |
| 18 | 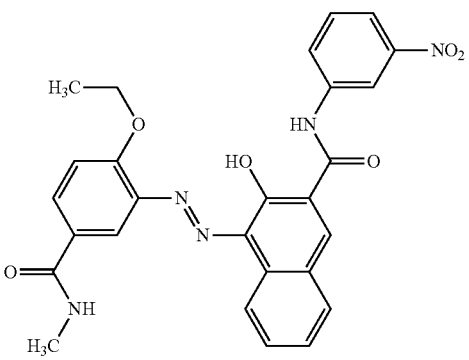 (18) | 58 | 351 |

TABLE 1-continued
| Example | Pigment of formula (I) | Chroma C | Hue angle h |
|---|---|---|---|
| 19 | 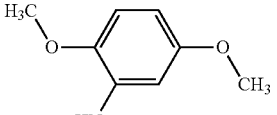 (19) | 64.5 | 4.5 |
| 20 | 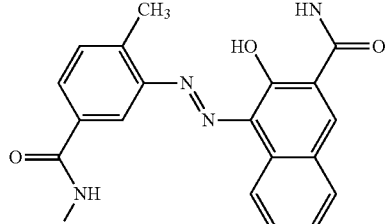 (20) | 62 | 1.5 |
| 21 | 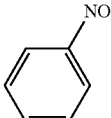 (21) | 64 | 357.5 |

TABLE 1-continued

| Example | Pigment of formula (I) | Chroma C | Hue angle h |
|---|---|---|---|
| 22 | (22) | 53 | 10.5 |
| 23 | (23) | 70 | 8.5 |
| 24 | (24) | 60 | 355 |
| 25 | (25) | 71 | 14 |

TABLE 1-continued

| Example | Pigment of formula (I) | Chroma C | Hue angle h |
|---|---|---|---|
| 26 | (26) | 53.5 | 12.5 |
| 27 | (27) | 66 | 14.5 |
| 28 | (28) | 57 | 357.5 |
| 29 | (29) | 55 | 358.5 |

TABLE 1-continued
| Example | Pigment of formula (I) | Chroma C | Hue angle h |
|---|---|---|---|
| 30 | 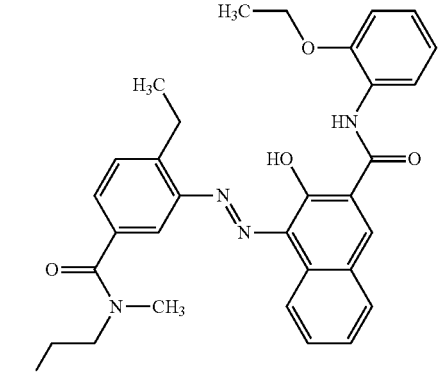 (30) | 59 | 14 |
| 31 | 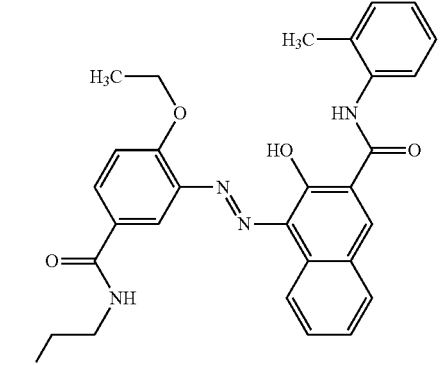 (31) | 63.5 | 10.5 |
| 32 | 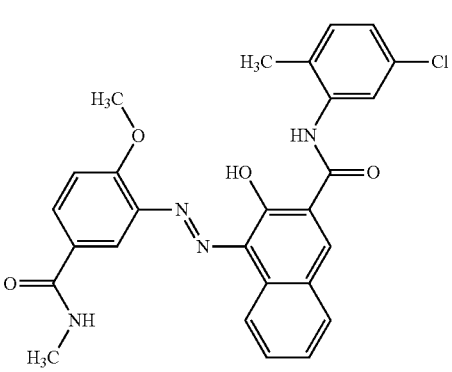 (32) | 63 | 358 |

TABLE 1-continued
| Example | Pigment of formula (I) | Chroma C | Hue angle h |
|---|---|---|---|
| 33 | 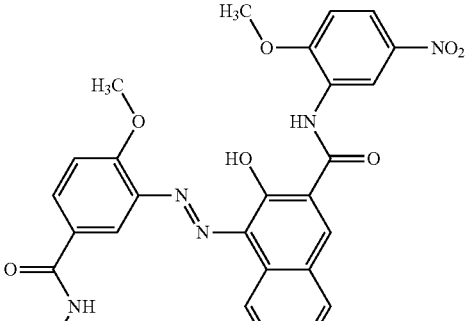<br>(33) | 59.5 | 355 |
| 34 | 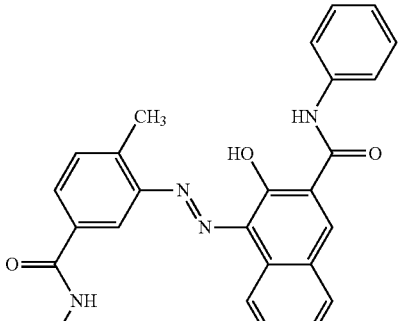<br>(34) | 69.5 | 15 |
| 35 | 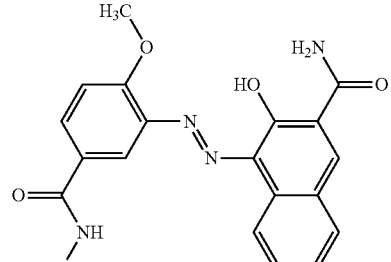<br>(35) | 68.5 | 9.5 |
| 36 | 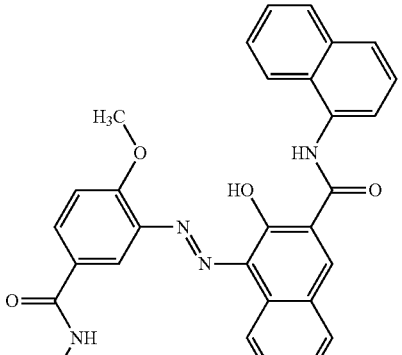<br>(36) | 64 | 3 |

TABLE 1-continued
| Example | Pigment of formula (I) | Chroma C | Hue angle h |
|---|---|---|---|
| 37 | 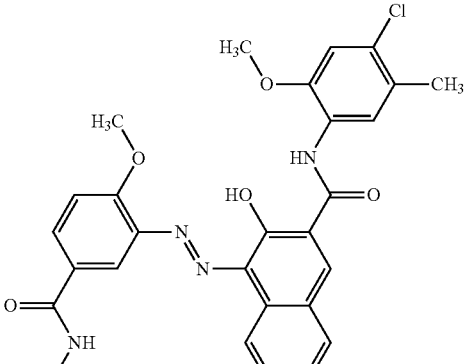 (37) | 65 | 356 |
| 38 | 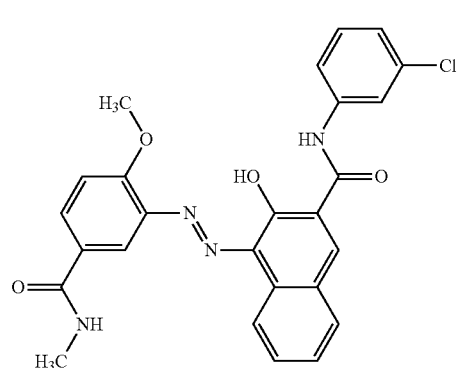 (38) | 62 | 3.5 |
| 39 | 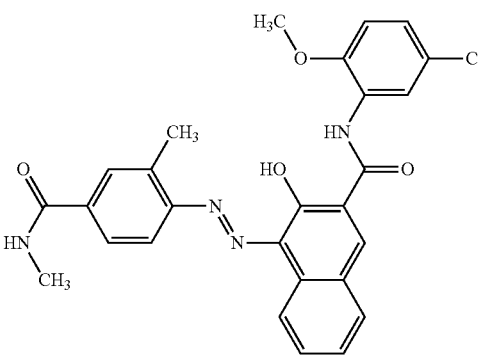 (39) | 68 | 6 |
| 40 | 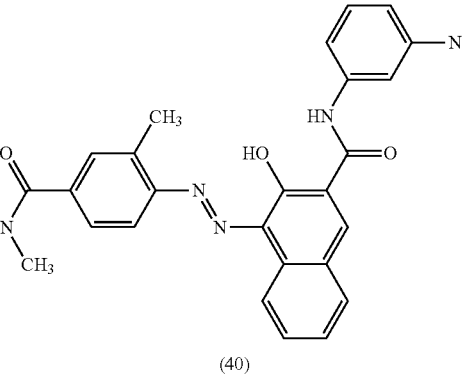 (40) | 61.5 | 357 |

TABLE 1-continued

| Example | Pigment of formula (I) | Chroma C | Hue angle h |
| --- | --- | --- | --- |
| 41 | (41) | 60.5 | 4 |
| 42 | (42) | 58.5 | 358 |
| 43 | (43) | 69.5 | 7.5 |

The invention claimed is:

1. A pigmented electrophotographic toner or developer comprising a high molecular weight organic material of natural or synthetic origin comprising a pigment of the formula (I)

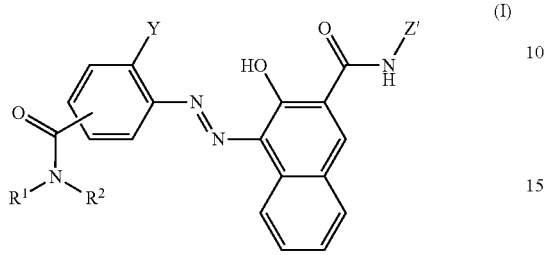

wherein
$R^1$ is methyl or $C_3$-$C_8$-alkyl;
$R^2$ is hydrogen or $C_1$-$C_4$-alkyl;
Y is $C_1$-$C_4$-alkyl or $C_1$-$C_4$-alkoxy; and
Z' is hydrogen, naphthyl, or substituted phenyl or substituted naphthyl, where the substituents are 1, 2, 3 or 4 in number and are selected from the group consisting of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-alkyl and $C_1$-$C_4$-alkoxy.

2. The pigmented electrophotographic toner or developer of claim 1,
wherein
$R^1$ is methyl;
$R^2$ is hydrogen or $C_1$-$C_4$-alkyl;
Y is $C_1$-$C_2$-alkyl or $C_1$-$C_2$-alkoxy; and
Z' is substituted phenyl, where the substituents are 1, 2 or 3 in number and are selected from the group consisting of halogen, nitro, cyano, $C_1$-$C_4$-alkyl and $C_1$-$C_4$-alkoxy.

3. The pigmented electrophotographic toner or developer of claim 1, wherein $R^2$ is hydrogen.

4. The pigmented electrophotographic toner or developer of claim 1, wherein Z' is nitro-, cyano- or $C_1$-$C_4$-alkyl-substituted phenyl.

5. The pigmented electrophotographic toner or developer of claim 1, wherein Z' is phenyl substituted by one, two or three radicals selected from the group consisting of methyl, ethyl and nitro.

6. The pigmented electrophotographic toner or developer of claim 1,
wherein
$R^1$ is methyl;
$R^2$ is hydrogen;
Y is $C_1$-$C_2$-alkoxy; and
Z' is methylphenyl or nitrophenyl.

7. An inkjet ink comprising a high molecular weight organic material of natural or synthetic origin comprising a pigment of the formula (I)

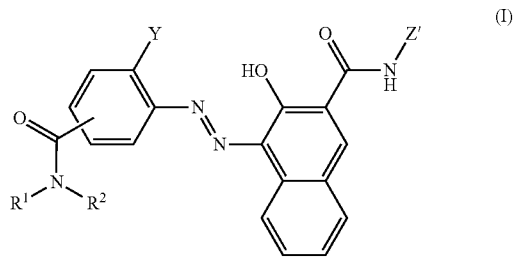

wherein
$R^1$ is methyl or $C_3$-$C_8$-alkyl;
$R^2$ is hydrogen or $C_1$-$C_4$-alkyl;
Y is $C_1$-$C_4$-alkyl or $C_1$-$C_4$-alkoxy; and
Z' is hydrogen, naphthyl, or substituted phenyl or substituted naphthyl, where the substituents are 1, 2, 3 or 4 in number and are selected from the group consisting of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-alkyl and $C_1$-$C_4$-alkoxy.

8. The inkjet ink of claim 7,
wherein
$R^1$ is methyl;
$R^2$ is hydrogen or $C_1$-$C_4$-alkyl;
Y is $C_1$-$C_2$-alkyl or $C_1$-$C_2$-alkoxy; and
Z' is substituted phenyl, where the substituents are 1, 2 or 3 in number and are selected from the group consisting of halogen, nitro, cyano, $C_1$-$C_4$-alkyl and $C_1$-$C_4$-alkoxy.

9. The inkjet ink of claim 7, wherein $R^2$ is hydrogen.

10. The inkjet ink of claim 7, wherein Z' is nitro-, cyano- or $C_1$-$C_4$-alkyl-substituted phenyl.

11. The inkjet ink of claim 7, wherein Z' is phenyl substituted by one, two or three radicals selected from the group consisting of methyl, ethyl and nitro.

12. The inkjet ink of claim 7,
wherein
$R^1$ is methyl;
$R^2$ is hydrogen;
Y is $C_1$-$C_2$-alkoxy; and
Z' is methylphenyl or nitrophenyl.

13. A pigmented color filter comprising a high molecular weight organic material of natural or synthetic origin comprising a pigment of the formula (I)

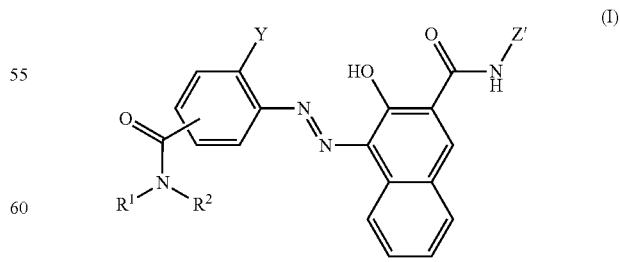

wherein
$R^1$ is methyl or $C_3$-$C_8$-alkyl;
$R^2$ is hydrogen or $C_1$-$C_4$-alkyl;
Y is $C_1$-$C_4$-alkyl or $C_1$-$C_4$-alkoxy; and Z' is hydrogen, naphthyl, or substituted phenyl or substituted naphthyl, where the substituents are 1, 2, 3 or 4 in number and are selected from the group consisting of halogen, nitro, cyano, $C_1$-$C_4$-alkoxycarbonyl, carbamoyl, $C_1$-$C_4$-alkylcarbamoyl, di($C_1$-$C_4$)-alkylcarbamoyl, phenylcarbamoyl, sulfamoyl, phenylsulfamoyl, $C_1$-$C_4$-alkylsulfamoyl, di($C_1$-$C_4$)-alkylsulfamoyl, $C_1$-$C_4$-alkyl and $C_1$-$C_4$-alkoxy.

14. The pigmented color filter of claim 13,
wherein
$R^1$ is methyl;
$R^2$ is hydrogen or $C_1$-$C_4$-alkyl;
Y is $C_1$-$C_2$-alkyl or $C_1$-$C_2$-alkoxy; and
Z' is substituted phenyl, where the substituents are 1, 2 or 3 in number and are selected from the group consisting of halogen, nitro, cyano, $C_1$-$C_4$-alkyl and $C_1$-$C_4$-alkoxy.

15. The pigmented color filter of claim 13, wherein $R^2$ is hydrogen.

16. The pigmented color filter of claim 13, wherein Z' is nitro-, cyano- or $C_1$-$C_4$-alkyl-substituted phenyl.

17. The pigmented color filter of claim 13, wherein Z' is phenyl substituted by one, two or three radicals selected from the group consisting of methyl, ethyl and nitro.

18. The pigmented color filter of claim 13,
wherein
$R^1$ is methyl;
$R^2$ is hydrogen;
Y is $C_1$-$C_2$-alkoxy; and
Z' is methylphenyl or nitrophenyl.

* * * * *